United States Patent [19]

Maezawa et al.

[11] Patent Number: 5,186,977
[45] Date of Patent: Feb. 16, 1993

[54] METHOD FOR MANUFACTURING FUNCTIONAL THIN FILM

[75] Inventors: Yoshiharu Maezawa, Shiga; Norimoto Nouchi, Katano, both of Japan

[73] Assignee: Matsushita Electric Industrial Co., Ltd., Kadoma, Japan

[21] Appl. No.: 688,136

[22] Filed: Apr. 22, 1991

[30] Foreign Application Priority Data

Apr. 23, 1990 [JP] Japan .................................. 2-107241

[51] Int. Cl.⁵ .............................................. B05D 5/12
[52] U.S. Cl. .................................... 427/132; 427/130; 427/248.1; 427/250; 427/255.1; 427/294; 427/295; 427/348; 427/349; 427/377
[58] Field of Search .................... 427/130, 132, 248.1, 427/250, 294, 109, 110, 348, 349, 255.1, 377

[56] References Cited

U.S. PATENT DOCUMENTS

| | | |
|---|---|---|
| 4,146,656 | 3/1979 | Kinugawa et al. ................ 427/109 |
| 4,451,501 | 5/1984 | Nagao et al. ...................... 427/40 |
| 4,474,832 | 10/1984 | Shirahata et al. ................. 427/130 |
| 4,477,489 | 10/1984 | Yanai et al. ...................... 427/132 |
| 4,585,689 | 4/1986 | Ohta et al. ........................ 427/164 |
| 4,702,938 | 10/1987 | Yasunaga et al. ................. 427/132 |
| 4,713,262 | 12/1987 | Yasunga et al. .................. 427/132 |
| 4,714,047 | 12/1987 | Ikeda et al. ..................... 427/255.1 |
| 4,800,105 | 1/1989 | Nakayama ..................... 427/255.1 |
| 4,801,500 | 1/1989 | Yasunaga et al. ................ 427/132 |
| 4,873,154 | 10/1989 | Yasunga et al. ................. 427/132 |
| 4,885,189 | 12/1989 | Yasunaga et al. ................ 427/132 |

Primary Examiner—Janyce Bell
Attorney, Agent, or Firm—Cushman, Darby & Cushman

[57] ABSTRACT

In a method for manufacturing a functional thin film by a vacuum evaporation method, during a thin film containing a material is evaporation-deposited on a substrate, a gas flow controls orientation of the material in a manner that the gas flow substantially intersects direction of flow of vapor of said material onto the substrate.

5 Claims, 4 Drawing Sheets

METHOD FOR MANUFACTURING FUNCTIONAL THIN FILM

FIELD OF THE INVENTION AND RELATED ART STATEMENT

1. Field of the Invention

The present invention relates to a method for manufacturing a functional thin film by using a vacuum evaporation, which enables improved orientation i.e. an improved uniform orientation or alignment of constituent particles, e.g. crystals, of the film, and high speed formation of film.

2. Description of the Related Art

The functional thin film is used for a metal thin film type magnetic recording medium having high recording density or for an orientated film of a liquid crystal device. The metal thin film type magnetic recording medium is suitable for high density magnetic recording, and the orientated film for a liquid crystal is one of the most important parts in the liquid crystal. They are applied in various fields covering a wide range, such as an imaging apparatus and an information machine.

With the increasing dependence of society on information, remarkable development of the magnetic recording medium, e.g. higher densities of recording, has been carried out. A coated magnetic recording medium is an example of the conventional recording media. The coated magnetic recording medium consists of a coated magnetic layer including powdered ferromagnetic material e.g. $\gamma$-$Fe_2O_3$ CrO or pure iron and binder on a high polymer film, and is used as an audio tape or a video tape.

A metal thin film type recording medium has been investigated in order to improve coercive force, recording density and electromagnetic transducing characteristics. The metal thin film type recording medium is formed by deposition of magnetic metal e.g. Fe, Ni, Co, Cr or the like or alloy thereof on a high polymer film by using a method of deposition (e.g. vacuum evaporation, a plating, ion plating or sputtering). A an audio tape and a video tape as ferromagnetic metal thin film type recording media are realized by using the method of vacuum evaporation wherein an oblique incident angle is used (hereinafter it is abbreviated to an oblique vacuum evaporation method).

A conventional metal thin film type recording medium is formed by evaporation-deposited Co-Ni-O on a non-magnetic substrate of polyethylene terephthalate (hereinafter it is abbreviated to PET) by using an oblique vacuum evaporation method wherein an incident angle of vaporized metal atom is in the range of from about 90° to about 40°. Hereinafter, the incident angle of vaporized metal atom is defined by measuring from the normal line to the face of the object film to be vaporized. The above-mentioned oblique vacuum evaporation method has the following problems: the evaporation rate of magnetic metal is very small, such as 10% or below, the deposition rate of the metal thin film is small and productivity of the magnetic recording medium is poor.

Further, there has been no way for controlling the orientation of crystals during deposition of the oblique vacuum evaporation method. So it has been difficult to obtain a well-balanced metal thin film type recording medium in both magnetic characteristics (e.g. coercivity) and electromagnetic transducing characteristics.

A metal thin film type perpendicular magnetic recording medium, which has been noticed in recent years, is formed by deposition of Co-Cr on a polyimide film (hereinafter it is abbreviated to PI) by using a vacuum evaporation for perpendicular magnetic recording medium wherein an incident angle of vaporized metal atoms is about 0°. Thus, evaporation rate is relatively larger than that of the above-mentioned oblique vacuum evaporation method. It is necessary to keep narrow the range of the incident angle such as 0°±5° determined by a gap between inhibitors (masks), since vaporized metal atoms having enlarged oblique incident angles have a bad influence upon the magnetic characteristics. That is, it is impossible to widen the gap between inhibitors (masks) which determine the incident angle in order to enlarge the deposition rate.

Thus the vacuum evaporation for perpendicular magnetic recording medium has the following problem similar to, the oblique vacuum evaporation method. Evaporation rate of magnetic metal is small and productivity of the magnetic recording medium is small. And further, there is also no way to control orientation of the crystal during deposition.

On the other hand, it has been required to develop an orientated film having improved orientation for use in a liquid crystal cell, since recently used color liquid crystal display devices use such a film more than a monochrome display device. The orientated film is of ferroelectric material formed on a substrate, e.g. glass plate. A conventional ferroelectric orientated film for a liquid crystal is developed on an extension of a TN (Twisted Nematic) liquid crystal. The conventional ferroelectric orientated film is mainly formed through rubbing of a film whereon polyimide is applied. But the conventional film is insufficient in orientation, since sufficient uniform orientation (alignment) of constituent particles (crystals) of the film has not been obtained.

Recently, an orientated film formed by using a conventional oblique vacuum evaporation of silicon oxide (SiO or $SiO_2$) has been investigated, and electric resistance heating is used in the oblique vacuum evaporation. When the orientated film is used as an orientated film for a liquid crystal, it is necessary to use an incident angle of vaporized atoms (of silicon oxide) only in the narrow range of from about 90° to about 85° in order to improve the resolution of the liquid crystal display. The range of the incident angle is smaller than that of the above-mentioned oblique vacuum evaporation method (i.e. 90°-40°). Thus, the oblique vacuum evaporation of silicon oxide has problems similar to the above-mentioned oblique vacuum evaporation method. That is, evaporation rate of silicon oxide is small, deposition rate of the silicon oxide film is small and productivity of the orientated film is small. And further, there is no way for control on orientation of constituent particles (crystals) during deposition, either.

OBJECT AND SUMMARY OF THE INVENTION

The present invention is intended to solve the above-mentioned problems, and the purpose of the present invention is to provide an improved method for manufacturing functional thin film which has splendid property of orientation (alignment) of constituent particles (crystals) of the film with high productivity.

The method for manufacturing functional thin film in accordance with the present invention is characterized in that the thin film is evaporation-deposited on the substrate with orientation of particles of the material under regulation by a gas flow in a manner that direction of the gas flow at a gas discharge nozzle substantially intersects direction of flow of vapor of the material onto the substrate.

By the method for manufacturing the functional thin film, the gas flow controls the orientation and the functional thin film having improved orientation of the material particles and having improved characteristics (e.g. magnetic characteristic and electromagnetic transducing characteristic or resolution and orientation distribution factor) is manufactured with high productivity.

Metal thin film type magnetic recording medium as one of the functional thin films can be made with a high productivity which is about two times as high as that by the conventional oblique deposition method without undesirable decrease of magnetic characteristics and electromagnetic transducing characteristics. That is, in the conventional oblique deposition method, it is necessary to use a narrow range of the incident angle e.g. from 90° to 40° in order to keep a sufficient electromagnetic transducing characteristic for a metal thin film deposited tape for video use. In contrast, according to the present invention, when such a wide range of the incident angle e.g. from 90° to 20° is used for realizing high productivity, a deposition rate which is larger than that of the conventional oblique deposition method is obtained. It is still possible to keep sufficient electromagnetic transducing characteristic equal or superior to that of the conventional oblique method, by utilization of the gas flow which substantially intersects the flow of vapor of magnetic metal. Further, when the above-mentioned wide range of the incident angle is used at the same deposition rate as that of the conventional oblique deposition method, significantly improved magnetic characteristics and electromagnetic transducing characteristics are obtained.

With regard to an orientated film for a liquid crystal as one of the functional thin films, improved orientation of the material particles and high productivity is obtained by utilization of the gas flow, which substantially intersects the flow of vapor of the material during deposition. By the comparison of the orientated film with a conventional one which is made by rubbing of the polyimide film, undesirable reversed domain (which is an area where the orientation is not uniform) is observed at the edge part of the conventional orientated film, so the conventional orientated film shows 80% of an orientation distribution factor (which is defined as a ratio of the area to a total area). In contrast, the orientated film obtained by the method of the present invention shows 100% of the orientation distribution factor, since, uniform orientation is obtained even at the edge part of the film.

In this case, resolution of the liquid crystal display constituted by using the orientated film of the present invention is kept on the same level as that of the liquid crystal display constituted by using a conventional orientated film formed by using the conventional oblique vacuum evaporation method, even though the deposition rate is larger than that of the conventional oblique deposition by two-digit figures.

In order to improve the advantage of the present invention, a most suitable pressure in a chamber for use is in the range of from $1 \times 10^{-3}$ Torr to $1 \times 10^{-5}$ Torr. In case the inside of the chamber is kept at lower vacuum than $1 \times 10^{-3}$ Torr, melting of an evaporating material; e.g. metal or silicon oxide (compound), becomes unstable. In case the inside of the chamber is kept at higher vacuum than $1 \times 10^{-5}$ Torr, the obtained effect of the present invention is not changed any more.

In order to enlarge the effect of the present invention, suitable thickness of the deposited metal thin (magnetic) film is above 300 Å. When the thickness becomes so large, cracks or the like are apt to occur on the film. Thus the suitable thickness is below 5000 Å. It is more preferable to use more than two nozzles for the gas flow in order to enlarge effect of the present invention.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DESCRIPTION OF THE PREFERRED EMBODIMENT

Hereafter, preferred embodiment of the present invention are explained with reference to the accompanying drawings.

Figure 1:
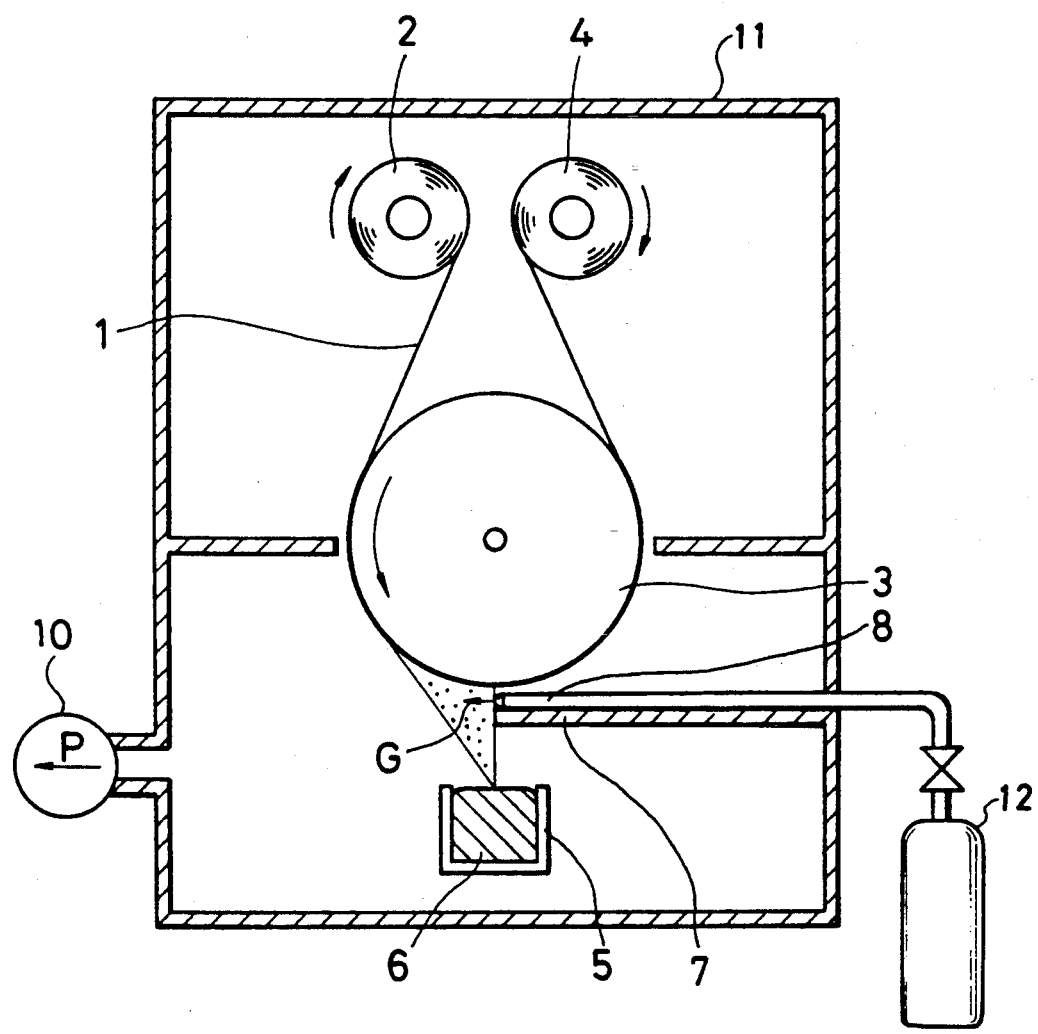
FIG. 1 is a side view of a first embodiment of vacuum evaporation apparatus for forming a longitudinal magnetic film on the substrate embodying the present invention.

1. First embodiment:

FIG. 1 is a side view of a first embodiment of vacuum evaporation apparatus for forming a longitudinal magnetic film on the substrate embodying the present invention.

A conventional vacuum pump 10 is used for realizing reduced atmosphere in a vacuum chamber 11. Magnetic material 6 in a melting pot 5 of porcelain (MgO) is melted by irradiation from a known 270°-deflection type electron gun (not shown in FIG. 1). Over the melting pot 5, a substrate 1 consisting of high polymer film is fed out from a supplying reel 2 and transferred on the circumference of a cylindrical cooling can 3, whereon evaporated magnetic material is deposited on the substrate 1 in transfer. The substrate 1 is wound on a winding reel 4.

Unnecessary flow of vapor of the evaporated magnetic material is obstructed by an inhibitor 7. In FIG. 1, the inhibitor 7 is disposed in a manner that it enables the flow of vapor within the range of incident angle from 90° to 0°.

A nozzle 8 is fixed on the inhibitor 7 in a manner that a gas flow from the nozzle 8 intersects the vapor flow. The gas flow is shown by an arrow G in FIG. 1. The direction of axis of the nozzle 8 is substantially parallel to the surface of the magnetic material 6 in the melting pot 5. The direction of the axis of the nozzle 8 can be slanted for the substrate 1, and the degree of such a slant depends on design of the vacuum evaporation apparatus. It is at least necessary that the gas flow from the nozzle 8 intersects the vapor flow.

In this invention, to intersect means that the direction of the gas flow which is immediately after leaving the nozzle is perpendicular to the direction of the flow of the vapor of the evaporated material.

The gas is introduced from a gas cylinder 12 into the vacuum chamber 11. An inert gas (e.g. nitrogen) alone or mixture of inert gas with oxygen is used as the gas. It is most preferable to use the nozzle 8 having a row of plural holes of small diameter disposed in a manner that the row of holes are in the direction perpendicular to the sheet of FIG. 1 in order to obtain uniform orientation of crystals of magnetic material (metal) across the whole width of the film.

The high polymer film used in the first embodiment shown in FIG. 1 can be made by selecting from the following materials: PET, polyethylene naphthalate (hereinafter it is abbreviated to PEN), PI, polyamide (e.g. aramid) and the like. The magnetic material for use in the first embodiment includes metals such as Co, Ni, Cr and Fe, and these metals can be matted alone or in combination with two or more as an alloy. The magnetic material is deposited on the high polymer film as a state of a metal, an alloy or a compound of metal (e.g. oxidized metal).

In order to obtain characteristics of sufficient electromagnetic transducing and the like, thickness of the deposited magnetic film needs to be above 300 Å. However, when the thickness becomes larger than 5000 Å, cracks or the like damage is apt to occur on the film. Thus the suitable thickness is between 300 Å and 5000 Å.

In case the pressure in the vacuum chamber 11 is higher than $1 \times 10^{-3}$ Torr, deposition becomes unstable, but even for the pressure which is lower than $1 \times 10^{-5}$ Torr the obtained effect is not changed. Therefore, the suitable range is between $1 \times 10^{-3}$ Torr and $1 \times 10^{-5}$ Torr.

EXAMPLE 1

Video tape samples of this Example 1 of the present invention were formed by using the first embodiment of the evaporation apparatus shown in FIG. 1. In this Example 1, a 10 μm thick and 150 mm wide PET film was used as a high polymer film, and Co-Ni (20 wt %) was used as the magnetic material 6, Co-Ni was deposited to form a 2000 Å thick magnetic film on the PET film which was running at 8 m/min. The obtained magnetic film was a longitudinal magnetic film that has the easy magnetization axis in longitudinal direction of the plane of the magnetic film. A mixed gas of nitrogen and oxygen is flown from the nozzle 8 toward the vapor flow of magnetic metal and the PET film at a rate of 0.5 l/min.

In this case, the number of the holes of the nozzle 8 was ten, and gas flows from each hole were made constant and even by design of each hole. Deposition was made under pressure of about $5 \times 10^{-5}$ Torr in vacuum chamber 11.

In this case the mixing ratio of nitrogen to oxygen was 4:1, and volume of the vacuum chamber was about 3 m³. But it was necessary to change the mixing ratio and/or the rate of gas flow according to design of the whole evaporation apparatus and condition of deposition.

COMPARISON EXAMPLE 1

Video tape samples of this Comparison example 1 were formed in the same manner as example 1 except the following points:

(1) An apparatus using the conventional oblique evaporation method was used, wherein the incident angle of vaporized atoms was in the range of from 90° to 40°.

(2) The same mixed gas was introduced into the vacuum chamber without using the nozzle 8 shown in FIG. 1.

Figure 2:
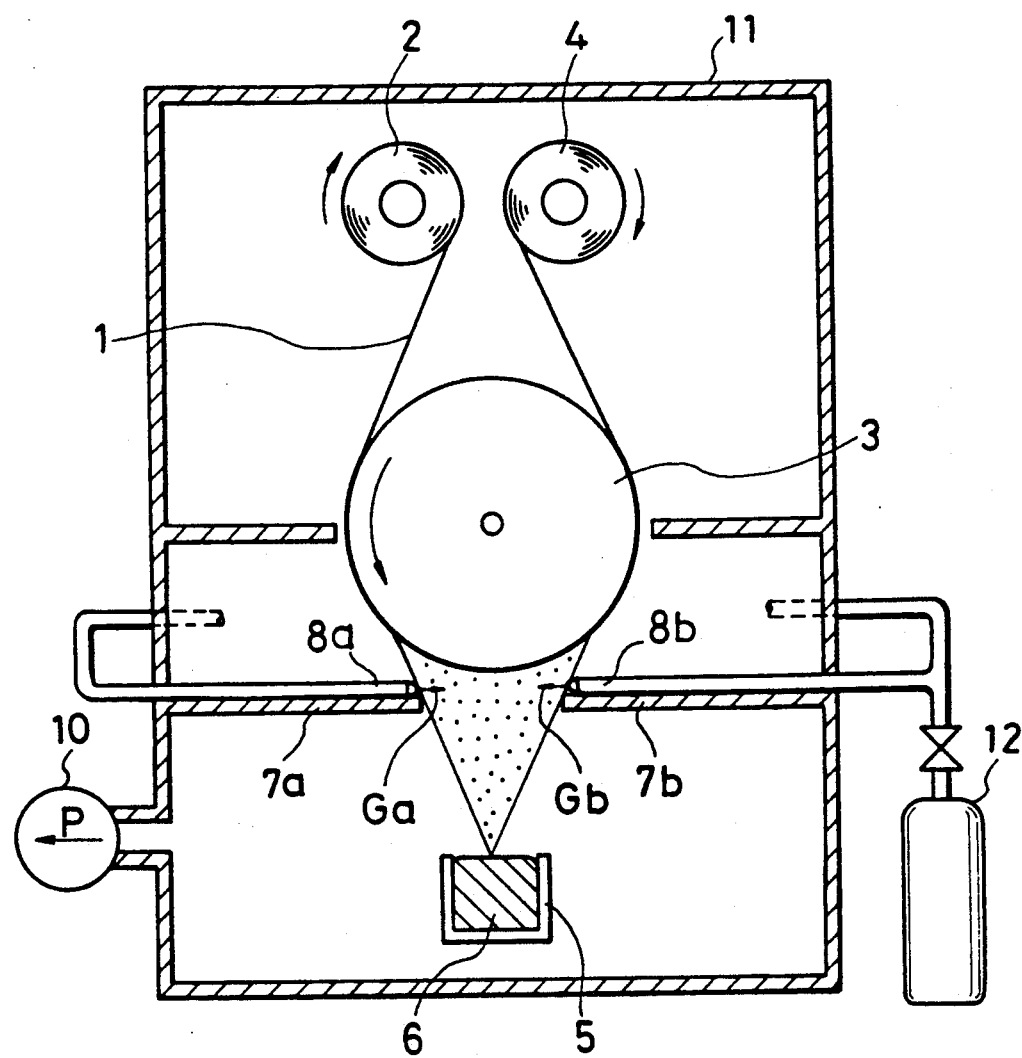
FIG. 2 is a side view of a second embodiment of vacuum evaporation apparatus for forming a perpendicular magnetic film on the substrate embodying the present invention.

2. Second embodiment:

FIG. 2 is a side view of a second embodiment of a vacuum evaporation apparatus for forming a perpendicular magnetic film on the substrate embodying the present invention. Corresponding parts and components to the first embodiment are shown by the same numerals and marks, and the description thereof made in the first embodiment still applies. Differences and features of this second embodiment from the first embodiment are as follows.

Unnecessary flow of vapor of the evaporated magnetic material is obstructed by inhibitors 7a and 7b to produce a regulated vapor flow. In FIG. 2, the inhibitors 7a and 7b are disposed in a manner that they enable the flow of vapor within the range of incident angle from +15° to -15°.

Nozzles 8a and 8b are fixed on the respective inhibitors 7a and 7b in a manner that respective gas flows from the nozzles 8a and 8b intersect the vapor flow. The gas flows are shown by arrows Ga and Gb in FIG. 2. The configuration and disposition of each nozzles 8a and 8b were the same as the nozzle 8 of the first embodiment.

Since heat-resistivity is necessary for the high polymer film used in the perpendicular magnetic recording medium, the film should be made from the following materials: polyimide, aramide, PET etc. The following materials, conditions and used in this second embodiment are the same as those shown in the first embodiment: the magnetic material, state of the deposited magnetic material, condition of deposition, thickness of the deposited magnetic material, introduced gas.

EXAMPLE 2

Video tape samples of this Example 2 of the present invention were formed by using the second embodiment of the evaporation apparatus shown in FIG. 2. In this Example 2, a 10 μm thick and 150 mm wide PI film was used as the high polymer film, Co-Ni (20 wt %) was used as the magnetic material. Co-Ni was deposited to form a 2000 Å thick magnetic film on the PI film which was running at 8 m/min. Nitrogen gas was flown from the nozzles 8a and 8b toward the vapor flow of the magnetic metal at a rate of 0.3 l/min. Deposition was made under pressure of about $2 \times 10^{-4}$ Torr, the obtained magnetic film was a perpendicular magnetic film that has the easy magnetization axis which is perpendicular to the surface of the magnetic film.

COMPARISON EXAMPLE 2

Video tape samples of this Comparison example 2 were formed by the same way as the example 2 except the following points:

(1) An apparatus using the conventional vacuum evaporation for perpendicular magnetic recording medium was used, wherein an incident angle of vaporized atom was in the rage of $0°\pm5°$.

(2) The same gas was introduced into the vacuum chamber without using the nozzles 8a and 8b shown in FIG. 2.

Figure 3:
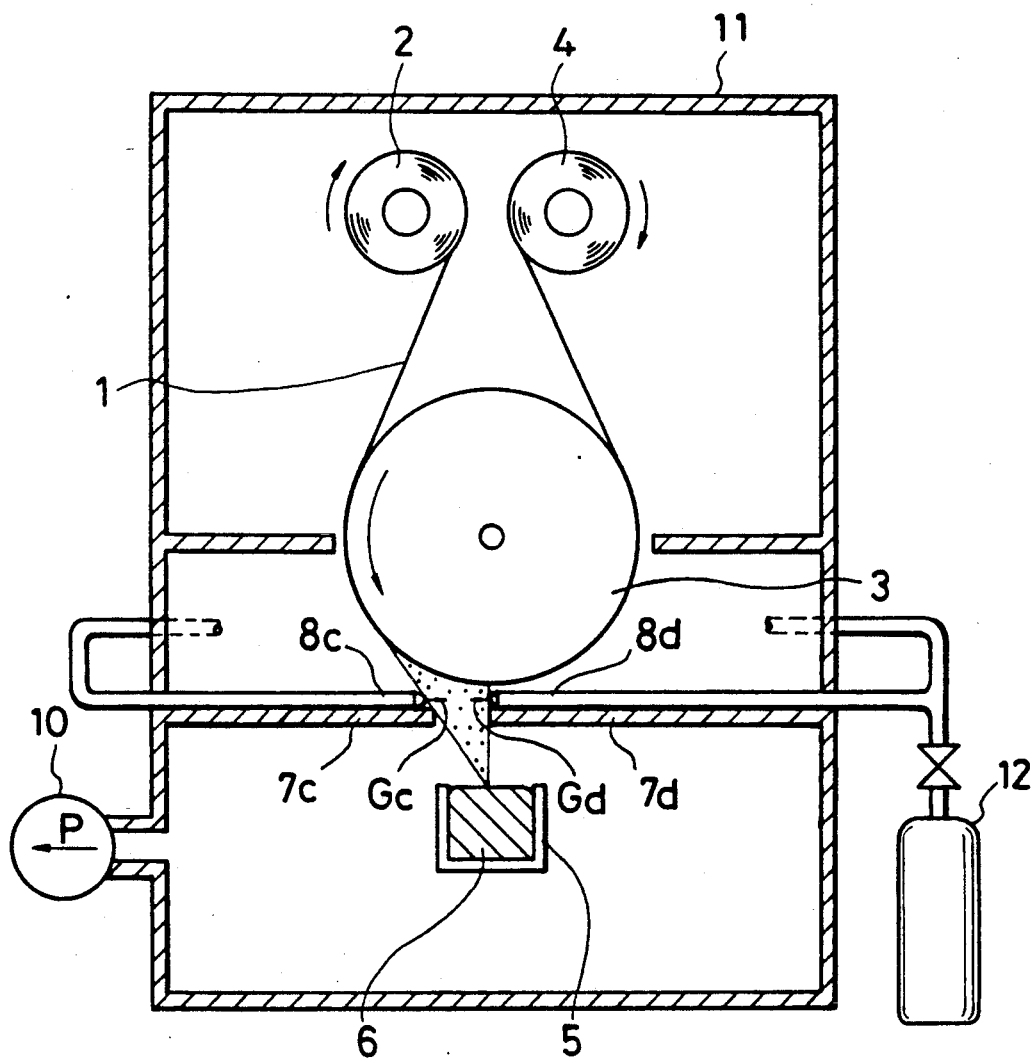
FIG. 3 is a side view of a third embodiment of vacuum evaporation apparatus for forming a longitudinal magnetic film on the substrate embodying the present invention.

3. Third embodiment:

FIG. 3 is a side view of a third embodiment of a vacuum evaporation apparatus for forming a longitudinal magnetic film on the substrate embodying the present invention. Corresponding parts and components to the first embodiment are shown by the same numerals and marks, and the description thereof made in the first embodiment still applies. Differences and features of this third embodiment from the first embodiment are as follows.

Unnecessary flow of vapor of the evaporated magnetic material is obstructed by inhibitors 7c and 7d to produce a regulated vapor flow. In FIG. 3, the inhibitors 7c and 7d are disposed in a manner that they enable flow of vapor flow within the range of incident angle from 90° (at position of starting deposition) to 0° (at position of finishing deposition).

Nozzles 8c and 8d are fixed on the respective inhibitors 7c and 7d in a manner that respective gas flow from the nozzles 8c and 8d intersect the vapor flow. The gas flow are shown by arrow Gc and Gd in FIG. 3. The configuration and disposition of each nozzles 8c and 8d were the same as the nozzle 8 of the first embodiment.

The high polymer film used in the third embodiment shown in FIG. 3 is made from the following materials, PET, PEN, PI, poliamide, aramide and the like. The following materials, conditions used in this third embodiment are the same as those shown in the first embodiment: the magnetic material, state of the deposited magnetic material, condition of deposition and introduced gas.

In order to keep a sufficient magnetic characteristic, a suitable thickness of the deposited metal thin (magnetic) film was above 300 Å. When the thickness becomes so large such as above 5000 Å, cracks or the like are apt to occur on the surface of the magnetic film, and the magnetic characteristic no longer improved. A most suitable pressure in the vacuum chamber 11 is in the range of from $1\times10^{-3}$ Torr to $1\times10^{-5}$ Torr, the range being the same as the range mentioned in the first embodiment.

EXAMPLE 3

Video tape samples of this Example 3 of the present invention were formed by using the third embodiment of the evaporation apparatus shown in FIG. 3. In this Example 3, a 10 μm thick and 150 mm wide PET film was used as a high polymer film, and Co-Ni (20 wt %) was used as the magnetic material. Co-Ni was deposited to form a 2000 Å thick magnetic film on the PET film which was running at 8 m/min. A mixed gas of nitrogen and oxygen is flown from the nozzle 8c at position of starting deposition (i.e. at the side of large incident angle) at a rate of 0.1 l/min, and the same mixed gas is flown from the nozzle 8d at position of finishing deposition (i.e. at the side of small incident angle) at a rate of 0.5 l/min. Deposition was made under pressure of about $5\times10^{-5}$ Torr. The obtained magnetic film was a longitudinal magnetic film that has the easy magnetization axis is longitudinal direction of the plane of magnetic film.

In this case mixing ratio of nitrogen to oxygen was 4:1, and volume of the vacuum chamber was about 3 m³. But it was necessary to change the mixing ratio and/or the rate of gas flow according to design of the whole evaporation apparatus and condition of deposition.

4. Evaluation tests:

The following evaluation tests were made on different tape sample obtained in the foregoing examples and comparison examples.

COERCIVE FORCE HC

The coercive force was measured with a vibration sample type magnetometer.

ELECTROMAGNETIC TRANSDUCING CHARACTERISTIC

An RF output (at 5 MHz) of each sample video tape was measured by using an 8 mm video system VTR. The measured RF output was expressed in terms of the value relative to that of the comparison example 1, and the RF output of the comparison example 1 was defined as 0 dB.

DEPOSITION RATE

Deposition rate (Å/sec) of the magnetic material deposited on the substrate was expressed in terms of the value relative to that of the comparison example 1.

Table 1 shows results of these evaluation tests as to respective sample tapes.

TABLE 1

| | Coercive force:Hc(Oe) | Electromagnetic transducing characteristic (dB) | Deposition rate |
|---|---|---|---|
| Example 1 | 1080 | 0 | 2 |
| Comparison example 1 | 1050 | 0 | 1 |
| Example 2 | 850 | +4 | 5 |
| Comparison example 2 | 800 | +3.8 | 3 |
| Example 3 | 1200 | +3.5 | 2 |

From the above-mentioned results shown in table 1, the following conclusion was obtained:

THE COMPARISON BETWEEN EXAMPLE 1 AND COMPARISON EXAMPLE 1

The coercive force and the RF output (dB), which indicates the magnetic characteristic and electromagnetic transducing characteristic of the Example 1, was equal to or better than that of the Comparison example 1. It means that improved orientation of crystals in the magnetic film was kept in spite of adopting a wide range (i.e. 90°–0°) of the incident angle of the vaporized atoms. The gas flow G controlled the effective range of incident angle widely, that is 90°–0°, in a manner that the incident angle is aligned in a certain range for forming the longitudinal magnetic film. That is, the improved orientation of crystals in the magnetic film was controlled by the gas flow G.

And a high speed deposition of the deposition rate which is two times as large as that of the Comparison example 1 was obtained in the Example 1. The reason is that the vaporized atoms in the range of incident angle from 40° to 0°, which could not be utilized in the conventional oblique evaporation method, were made to be utilized by the gas flow G shown in FIG. 1, so that the deposition rate of the Example 1 became two times as large as that of the Comparison example 1.

THE COMPARISON BETWEEN EXAMPLE 2 AND COMPARISON EXAMPLE 2

The coercive force and the RF output of the Example 2 was equal to or better than that of the comparison example 2. It means that improved orientation of crystals in the magnetic film was kept in spite of adopting a wide range (i.e. $+15°-−15°$) of the incident angle of the vaporized atoms. The gas flows Ga and Gb controlled the effective range of incident angle widely, that is $+15°-−15°$, in a manner that the incident angle is aligned in a certain range (i.e. about 0°) for forming the perpendicular magnetic film. That is, the improved orientation of crystals in the perpendicular magnetic film was controlled by the gas flows Ga and Gb.

And a high speed deposition of the deposition rate which is about two times as large as that of the comparison example 2, was obtained in the example 2. The reason is that the vaporized atoms in the range of the incident angle from $+15°$ to $+5°$ and that of from $-5°$ to $-15°$, which could not be utilized in the conventional vacuum evaporation for perpendicular magnetic recording medium, were made to be utilized by the gas flows Ga and Gb shown in FIG. 2, so that the deposition rate of the example 2 became about two times as large that of the comparison example 2.

THE COMPARISON OF THE EXAMPLE 3 AND THE EXAMPLE 1

The deposition rate of the Example 3 was the same as that of the Example 1. In the Example 3, introduction of both gas flows (Gc, Gd) shown in FIG. 3 at the side of starting of deposition and at the side of finishing of deposition resulted in improved coercive force and electromagnetic transducing characteristic, owing to improvement of orientation of crystals in the magnetic film. In this example 3, the vaporized atoms which were not suitable in about G 90° range of incident angle were utilized for forming the longitudinal magnetic film by the gas flow Gd. That is, the gas flow Gd controlled the incident angle of the vaporized atoms effectively regulating the incident angle to a certain angle, without making loss of the evaporated material, thereby efficiently forming the longitudinal magnetic film. Similarly, the gas flow Gc also controlled the incident angle of the vaporized atoms.

An angle of the orientation of crystals (hereinafter it is abbreviated to an orientation angle) of the longitudinal magnetic film was controlled by both gas flows Gd and Gc. In other words, the orientation angle is varied and controlled by the conditions (e.g. rate of gas flow, mixing ratio of constituent gas etc.) of the gas flows Gd and Gc. Determination of conditions of the gas flow for a suitable control on an orientation angle depends on design of the nozzles, the vacuum chamber etc. It is needless to say that the orientation angle of the magnetic film can be controlled similarly by the gas flow(s) in the above-mentioned first and second embodiments.

Figure 4:
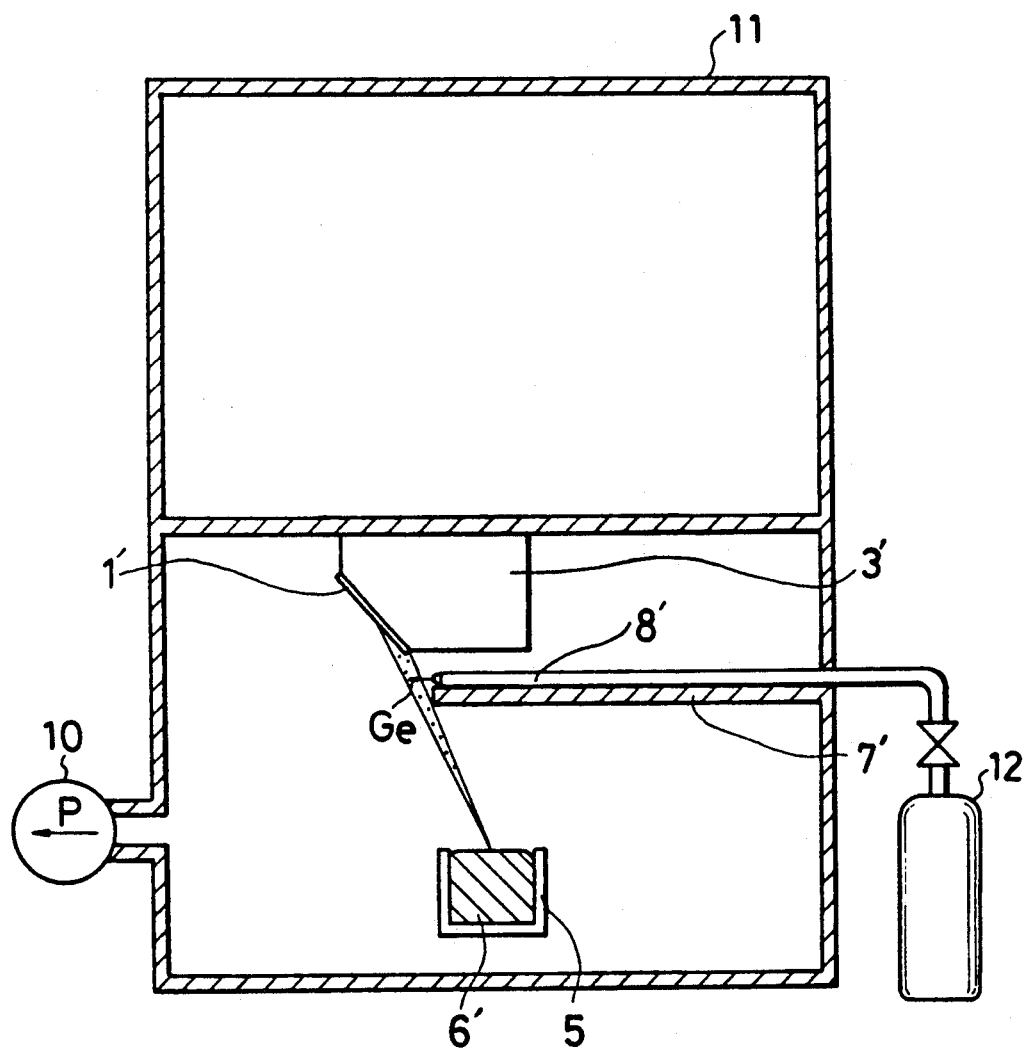
FIG. 4 is a side view of a fourth embodiment of vacuum evaporation apparatus for forming an orientated film for a liquid crystal on a substrate embodying the present invention.

5. Fourth Embodiment:

FIG. 4 is a side view of a fourth embodiment of vacuum evaporation apparatus for forming an orientated film on a substrate for a liquid crystal device embodying the present invention.

Corresponding parts and components to the first embodiment are shown by the same numerals and marks, and the description thereon made in the first embodiment similarly apply. Differences and features of this fourth embodiment from the first embodiment are as follows.

An evaporating material 6' including silicon (e.g. silicon in free state or silicon oxide) in a melting pot 5 of porcelain (MgO) is melted by irradiation from a known 270°-deflection type electron gun (not shown in FIG. 4). A substrate 1' of glass is fixed on a holder 3' over the melting pot 5, and material evaporated from the evaporating material 6' is deposited onto the substrate 1'.

Unnecessary flow of vapor of the evaporated material is obstructed by an inhibitor 7'. The inhibitor 7' is disposed in a manner effectively to regulate the flow of vapor within the range of incident angles from 90° to 70°.

A nozzle 8' is fixed on the inhibitor 7' in a manner that a gas flow from the nozzle 8' interstects the vapor flow. The gas flow is shown by an arrow Ge in FIG. 4. The configuration and disposition of the nozzle 8' was the same as the nozzle 8 of the first embodiment.

The evaporating material 6' of silicon can be chosen properly from: SiO, SiO$_2$, free state silicon, etc. Suitable range of the thickness of deposited film on the substrate is from 300 Å to 5000 Å.

EXAMPLE 4

Orientated film samples of this example 4 of the present invention was formed by using the fourth embodiment of the evaporation apparatus shown in FIG. 4.

In this example 4, a 0.5 mm thick, 150 mm long and 150 mm wide glass plate was used as the substrate 1', free state silicone was used as the evaporating material 6' of silicon. A mixed gas of nitrogen and oxygen was flown from the nozzle 8' at a rate of 0.1 l/min toward the vapor flow of the silicon. And silicon oxide was deposited to form a 2000 Å thick orientated film for a liquid crystal on the glass plate.

Deposition was made under pressure of about $5 \times 10^{-5}$ Torr.

In this case mixing ratio of nitrogen to oxygen was 4:1, and volume of the vacuum chamber was about 3 m$^3$. It was necessary to change the mixing ratio and/or the rate of gas flow according to design of the whole evaporation apparatus and condition of deposition.

COMPARISON EXAMPLE 4

Orientated film samples of this comparison example 4 were formed by the same way as the example 4 except the following points:

(1) The apparatus shown in FIG. 4 was also used as an apparatus of a conventional oblique vacuum evaporation (method), wherein an incident angle of vaporized atoms was set in the range of from 90° to 85° by disposition of the inhibitor 7'.

(2) The same mixed gas was introduced into the vacuum chamber 11 without using the nozzle 8' shown in FIG. 4.

COMPARISON EXAMPLE 5

Orientated film samples of this comparison example 5 were formed by rubbing of the polyimide film formed on the glass plate which was the same as that used in the example 4.

6. Evaluation test

The following evaluation tests were made on different samples obtained in the foregoing example and comparison examples.

OBSERVATION AS A LIQUID CRYSTAL DISPLAY

A liquid crystal display was assembled by using the orientated film sample. Resolution and reversed domain of the liquid crystal display was observed in the state of actual use. The result of the observation was defined as follows;

(1) As to resolution

The resolution observed in the comparison example 4 was defined as "Good". Resolution of the example 4 and the comparison example 5 were observed in comparison with that observed in the comparison example 4. In case the resolution was not as good as the comparison example 4, the resolution was defined as "Poor".

(2) As to reversed domain

Undesirable reversed domain means an area where the orientation is not uniform. A ratio of an area whereon no reversed domain is observed to a total area of the display is defined as an orientation distribution factor (%). That is, 100% of the orientation distribution factor means that no reversed domain is observed.

DEPOSITION RATE

Deposition rate (Å/sec) of the silicon compound on the substrate was expressed in terms of the value relative to that of the comparison example 4.

Table 2 shows results of these evaluation tests as to respective samples.

TABLE 2

|  | Observation as a liquid crystal display | | |
|---|---|---|---|
|  | Resolution | Orientation distribution factor | Deposition rate |
| Example 4 | Good | 100% | 100 |
| Comparison example 4 | Good | 100% | 1 |
| Comparison example 5 | Poor | 80% | — |

From the above-mentioned results shown in table 2, the following conclusion was obtained:

THE COMPARISON BETWEEN EXAMPLE 4 AND COMPARISON EXAMPLE 4

The resolution and the orientation distribution factor, which indicate the most important characteristics of the liquid crystal display of the example 4 were equal to that of the comparison example 4. It means that improved orientation of crystals in the orientated film was kept in spite of adopting a wide range (i.e. 90°–70°) of the incident angle of the vaporized silicone compounds. The gas flow Ge controlled the effective range of incident angle widely, that is 90°–70°, in a manner that the incident angle is aligned in a certain range for forming an improved orientated film. In addition, the deposition rate was larger than that of the conventional oblique vacuum evaporation method by two-digit figures, and it resulted in drastically high productivity.

THE COMPARISON BETWEEN EXAMPLE 4 AND COMPARISON EXAMPLE 5

In the Example 4, the most important characteristics of the liquid crystal display, that is, resolution and orientation distribution factor, were better than those of the Comparison example 5.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. In a method for manufacturing a functional thin film wherein a thin film containing at least a magnetic material is formed on a substrate by a vacuum evaporation method, the improvement comprising
    evaporation depositing said thin film on said substrate with an orientation of particles of said magnetic material being uniform across said thin film, and
    simultaneously flowing an inert gas from a gas discharge nozzle toward a vapor flow of said magnetic material onto said substrate so as to substantially intersect a direction of said vapor flow.

2. A method in accordance with claim 1, wherein said magnetic material is at least one member selected from the group consisting of Co, Fe, Cr and Ni.

3. A method in accordance with claim 1, wherein said thin film has a thickness in the range of from 300 Å to 5000 Å.

4. A method in accordance with claim 1, said functional film is formed under a pressure in the range of from $1 \times 10^{-3}$ Torr to $1 \times 10^{-5}$ Torr.

5. In a method for manufacturing a functional thin film wherein a thin film containing at least a magnetic material is formed on a substrate by a vacuum evaporation method, the improvement comprising
    evaporation depositing said thin film on said substrate with an orientation of particles of said magnetic material being uniform across said thin film, and
    simultaneously flowing one of an inert gas and a mixture of an inert gas and oxygen from a gas discharge nozzle toward a vapor flow of said magnetic material onto said substrate so as to substantially intersect a direction of said vapor flow.

* * * * *